(12) United States Patent
Zhu et al.

(10) Patent No.: US 8,790,940 B2
(45) Date of Patent: *Jul. 29, 2014

(54) METHOD FOR MAKING LIGHT EMITTING DIODE

(75) Inventors: Zhen-Dong Zhu, Beijing (CN);
Qun-Qing Li, Beijing (CN); Li-Hui Zhang, Beijing (CN); Mo Chen, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 96 days.

This patent is subject to a terminal disclaimer.

(21) Appl. No.: 13/479,232

(22) Filed: May 23, 2012

(65) Prior Publication Data

US 2013/0143341 A1 Jun. 6, 2013

(30) Foreign Application Priority Data

Dec. 3, 2011 (CN) .......................... 2011 1 0395474

(51) Int. Cl.
*H01L 21/00* (2006.01)
*H01L 33/00* (2010.01)

(52) U.S. Cl.
CPC ................................. *H01L 33/0079* (2013.01)
USPC .................................. 438/29; 438/71; 438/98

(58) Field of Classification Search
CPC .................................................. H01L 33/0079
USPC .................................................. 438/29, 71, 98

See application file for complete search history.

(56) References Cited

U.S. PATENT DOCUMENTS

| | | | | |
|---|---|---|---|---|
| 6,825,408 | B2 * | 11/2004 | Nagano et al. ................ | 136/246 |
| 7,384,809 | B2 * | 6/2008 | Donofrio ........................ | 438/29 |
| 7,893,448 | B2 * | 2/2011 | Kim ................................ | 257/95 |
| 8,575,633 | B2 * | 11/2013 | Donofrio et al. ............... | 257/98 |
| 2007/0018182 | A1 * | 1/2007 | Beeson et al. .................. | 257/98 |
| 2007/0166862 | A1 * | 7/2007 | Kim et al. ....................... | 438/42 |
| 2007/0202624 | A1 * | 8/2007 | Yoon et al. ..................... | 438/29 |
| 2013/0143340 | A1 * | 6/2013 | Zhu et al. ....................... | 438/29 |
| 2013/0143342 | A1 * | 6/2013 | Zhu et al. ....................... | 438/29 |

* cited by examiner

*Primary Examiner* — Luan C Thai
(74) *Attorney, Agent, or Firm* — Novak Druce Connolly Bove + Quigg LLP

(57) ABSTRACT

A method for making light emitting diode includes the following steps. A substrate is provided. A first semiconductor layer is grown on a surface of the substrate. A patterned mask layer is located on a surface of the first semiconductor layer, and the patterned mask layer includes a number of bar-shaped protruding structures, a slot is defined between each two adjacent protruding structures to expose a portion of the first semiconductor layer. The exposed first semiconductor layer is etched to form a protruding pair. A number of three-dimensional nano-structures are formed. An active layer and a second semiconductor layers are grown on the number of three-dimensional nano-structures in that order. The substrate is removed and a surface of the first semiconductor layer is exposed. A first electrode is applied to cover the exposed surface. A second electrode is electrically connected with the second semiconductor layer.

20 Claims, 9 Drawing Sheets

US 8,790,940 B2

METHOD FOR MAKING LIGHT EMITTING DIODE

CROSS-REFERENCE TO RELATED APPLICATIONS

This application claims all benefits accruing under 35 U.S.C. §119 from China Patent Application No. 201110395474.7, filed on Dec. 3, 2011 in the China Intellectual Property Office, disclosure of which is incorporated herein by reference. This application is related to applications entitled, "LIGHT EMITTING DIODE", filed May 23, 2012 Ser. No. 13/479,223; "LIGHT EMITTING DIODE", filed May 23, 20012 Ser. No. 13/479,225; "LIGHT EMITTING DIODE", filed May 23, 2012 Ser. No. 13/479,227; "METHOD FOR MAKING LIGHT EMITTING DIODE", filed May 23, 2012 Ser. No. 13/479,229; "LIGHT EMITTING DIODE", filed May 23, 2012 Ser. No. 13/479,230; "LIGHT EMITTING DIODE", filed May 23, 2012 Ser. No. 13/479,233; "METHOD FOR MAKING LIGHT EMITTING DIODE", filed May 23, 2012 Ser. No. 13/479,234; "LIGHT EMITTING DIODE", filed May 22, 2012 Ser. No. 13/477,273.

BACKGROUND

1. Technical Field

The present disclosure relates to a light emitting diode (LED) and the method for making the same.

2. Description of the Related Art

LEDs are semiconductors that convert electrical energy into light. Compared to conventional light sources, the LEDs have higher energy conversion efficiency, higher radiance (i.e., they emit a larger quantity of light per unit area), longer lifetime, higher response speed, and better reliability. LEDs generate less heat. Therefore, LED modules are widely used as light sources in optical imaging systems, such as displays, projectors, and so on.

LEDs include an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and photons in the N-type semiconductor layer can enter the active layer and combine with each other to emit visible light.

However, the extraction efficiency of LEDs is low because the contact area between the N-type semiconductor layer and the active layer is not large enough. Thus the electron-hole recombination density is low, and the photons in the LED are sparse, thereby degrading the extraction efficiency.

What is needed, therefore, is a light emitting diode and a method for making the same, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
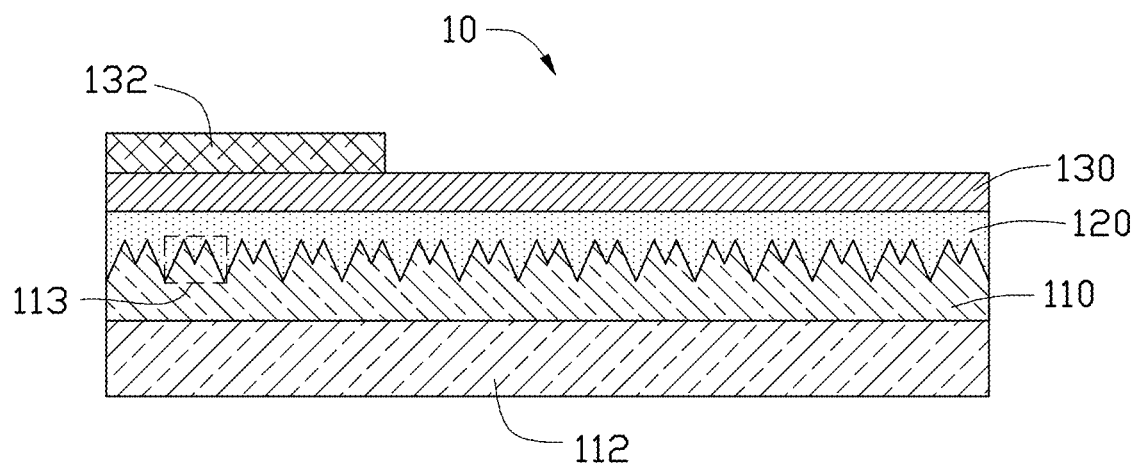
FIG. 1 shows a schematic view of one embodiment of an LED.

Referring to FIG. 1, an LED 10 includes a first semiconductor layer 110, an active layer 120, a second semiconductor layer 130, a first electrode 112, and a second electrode 132. The first semiconductor layer 110 defines a plurality of three-dimensional nano-structures 113. The active layer 120 is sandwiched between the first semiconductor layer 110 and the second semiconductor layer 130. The first semiconductor layer 110 includes a first surface and a second surface opposite to the first surface. The active layer 120 and the second semiconductor layer 130 are stacked on the second surface of the first semiconductor layer 110. The first electrode 112 covers the entire first surface of the first semiconductor layer 110, and the second electrode 132 is electrically connected with the second semiconductor layer 130. The plurality of three-dimensional nano-structures 113 are formed on the second surface of the first semiconductor layer 110.

The first semiconductor layer 110 is formed on the epitaxial growth surface 101. The first semiconductor layer 110 is an N-type semiconductor or a P-type semiconductor. The material of the N-type semiconductor can include N-type gallium nitride, N-type gallium arsenide, or N-type copper phosphate. The material of the P-type semiconductor can include P-type gallium nitride, P-type gallium arsenide, or P-type copper phosphate. The N-type semiconductor is configured to provide photons, and the P-type semiconductor is configured to provide holes. The thickness of the first semiconductor layer 110 ranges from about 1 μm to about 5 μm. In one embodiment, the first semiconductor layer 110 is an N-type gallium nitride doped with Si.

Figure 2:
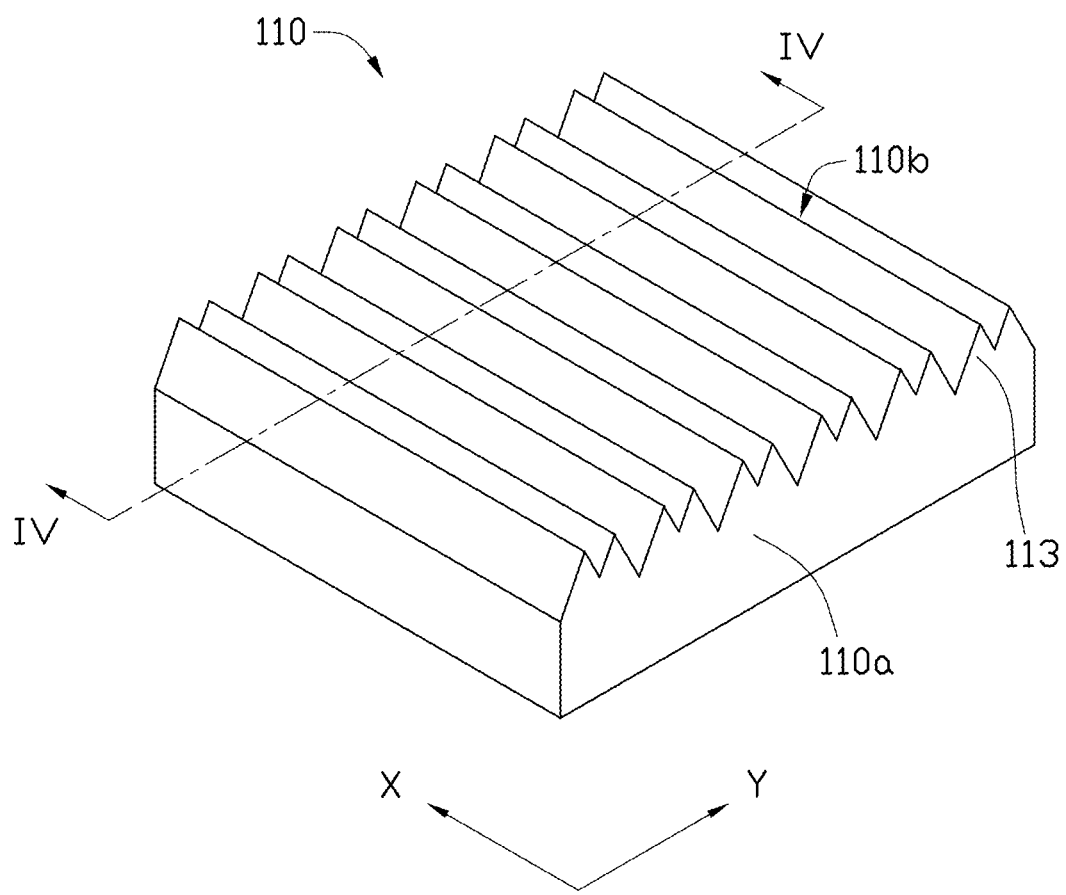
FIG. 2 is an isometric view of one embodiment of a three-dimensional nano-structures array in the LED of FIG. 1.

Referring to FIG. 1 and FIG. 2, the second surface of the first semiconductor layer 110 is a patterned surface. The first semiconductor layer 110 can be separated into a main body 110a and a protruding part 110b and distinguished by an "interface." The interface can be parallel with the first surface of the first semiconductor layer 110. The interface is configured as a surface of the main body 110a, and the protruding part 110b is extending away from the interface. The protruding part 110b defines the plurality of three-dimensional nano-structures 113, and the plurality of three-dimensional nano-structures 113 form the patterned surface of the first semiconductor layer 110. The three-dimensional nano-structure 113 can be a protruding structure. The protruding structure protrudes out from the interface of the main body 110a. The plurality of three-dimensional nano-structures 113 is a protruding structure located on the interface of the main body 110a.

Figure 3:
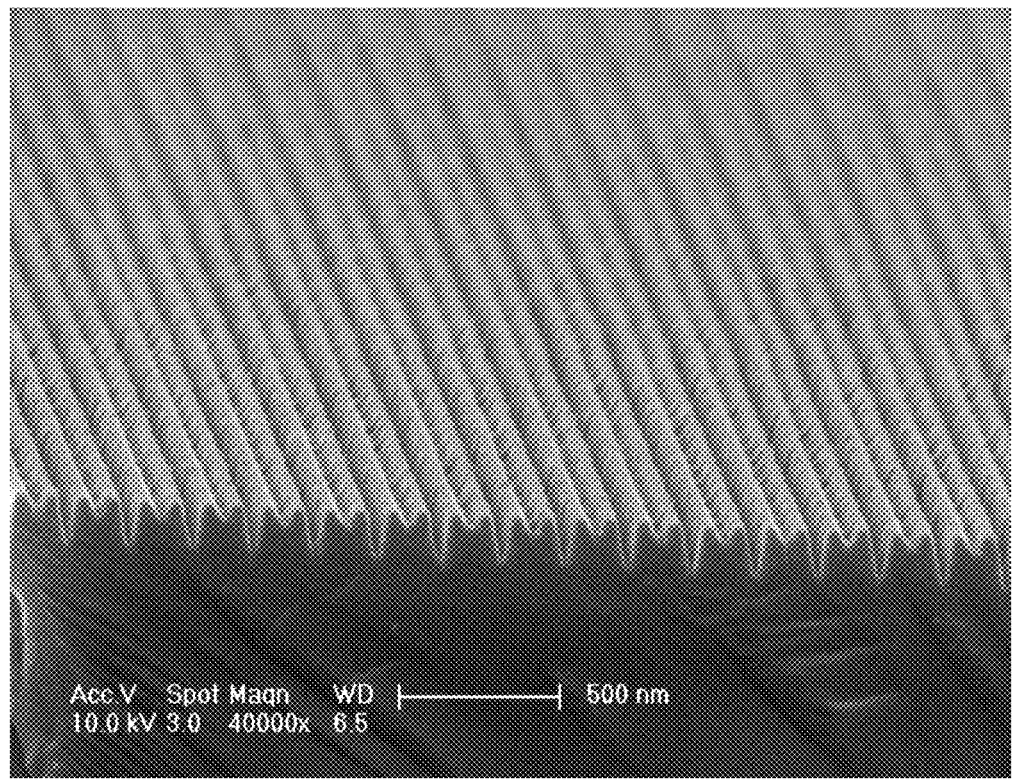
FIG. 3 shows a scanning electron microscope (SEM) image of the three-dimensional nano-structures array of FIG. 2.
Figure 4:
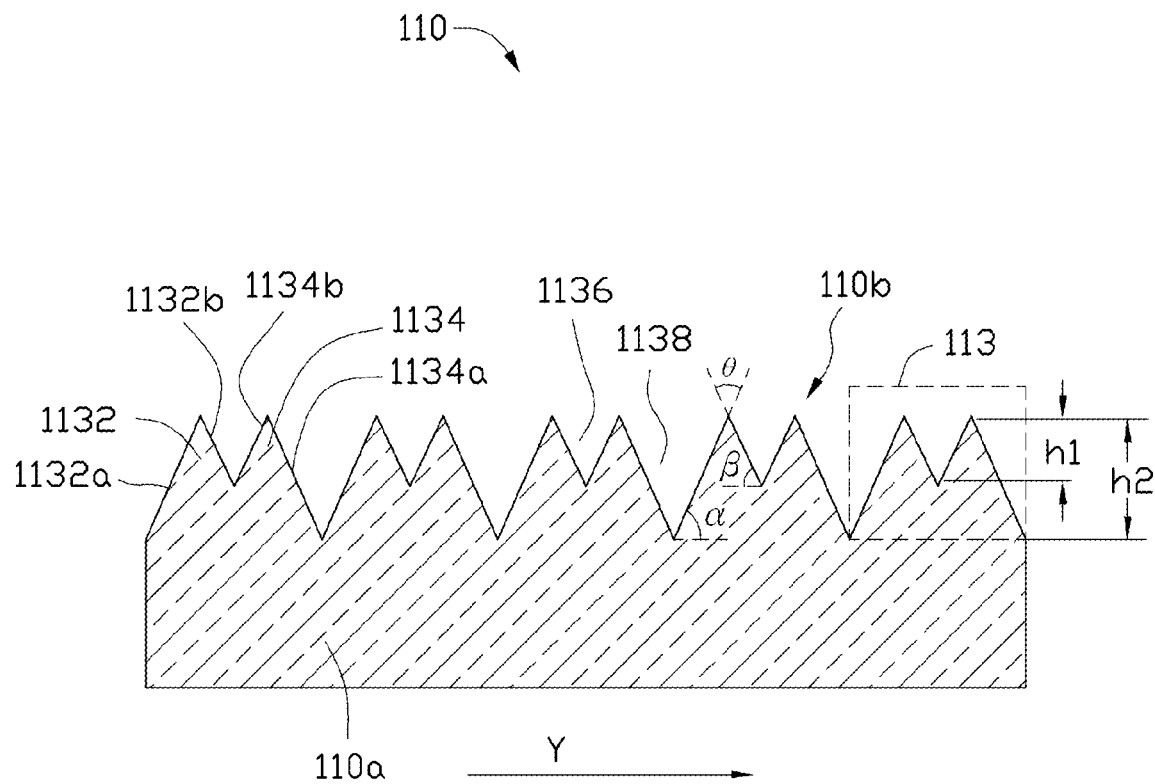
FIG. 4 shows cross-sectional view along a line IV-IV of FIG. 2.

The plurality of three-dimensional nano-structures 113 can be arranged side by side. The plurality of three-dimensional nano-structures 113 forms the patterned surface. Each of the three-dimensional nano-structures 113 can extend along a straight line, a curvy line, or a polygonal line. The extending direction is substantially parallel with the surface of the first semiconductor layer 110. The two adjacent three-dimensional nano-structures are arranged a certain distance apart from each other. The distance ranges from about 0 nanometers to about 1000 nanometers, such as 10 nanometers, 30 nanometers, or 200 nanometers. The extending direction of the three-dimensional nano-structure 113 can be fixed or varied. While the extending direction of the three-dimensional nano-structure 113 is fixed, the plurality of three-dimensional nano-structures 113 extends along a straight line, otherwise the three-dimensional nano-structures 113 extends along a polygonal line or a curvy line. The cross-sectional of the three-dimensional nano-structure 113 along the extending direction is M-shaped. Referring to FIG. 3, the three-dimensional nano-structures 113 are a plurality of substantially parallel bar-shaped protruding structures extending along a straight line. The plurality of three-dimensional nano-structures 113 are substantially uniformly and equidistantly distributed on the entire surface of the main body 110a.

The three-dimensional nano-structure 113 extends from one side of the semiconductor layer 110 to the opposite side along the X direction. The Y direction is substantially perpendicular to the X direction and substantially parallel with the surface of the main body 110a. The three-dimensional nano-structure 113 is a double-peak structure including two peaks. The cross-section of the double-peak structure is in the shape of M. Each M-shaped three-dimensional nano-structure 113 includes a first peak 1132 and a second peak 1134. The first peak 1132 and the second peak 1134 substantially extend along the X direction. The first peak 1132 includes a first surface 1132a and a second surface 1132b. The first surface 1132a and the second surface 1132b intersect to form an intersection line and an included angle θ of the first peak 1132. The intersection line can be a straight line, a curvy line, or a polygonal line. The included angle θ is greater than 0 degree and smaller than 180 degrees. In one embodiment, the included angle θ ranges from about 30 degrees to about 90 degrees. The first surface 1132a and the second surface 1132b can be planar, curvy, or wrinkly. In one embodiment, the first surface 1132a and the second surface 1132b are planar. The first surface 1132a is intersected with the surface of the main body 110a at an angle α. The angle α is greater than 0 degrees and less than or equal to 90 degrees. In one embodiment, the angle α is greater than 80 degrees and less than 90 degrees. The first surface 1132a includes a side connected to the surface of the substrate 100, and extends away from the main body 110a to intersect with the second surface 1132b. The second surface 1132b includes a side connected with the second peak 1134 and extends away from the main body 110a with an angle β. The angle β is greater than 0 degrees and smaller than 90 degrees.

The second peak 1134 includes a third surface 1134a and a fourth surface 1134b. The structure of the second peak 1134 is substantially the same as the structure of the first peak 1132. The third surface 1134a and the fourth surface 1134b intersect with each other to form the included angle of the second peak 1134. The third surface 1134a includes a side intersected with the surface of the main body 110a, and extends away from the main body 110a to intersect with the fourth surface 1134b. The fourth surface 1134b includes a side intersected with the third surface 1134a to form the included angle of the second peak 1134, and extends to intersect with the second surface 1132b of the first peak 1132 to define a first groove 1136. A second groove 1138 is defined between two adjacent three-dimensional nano-structures 113. The second groove 1138 is defined by the third surface 1134a of the second peak 1134 and the first surface 1132a of the first peak 1132 of the adjacent three-dimensional nano-structure 113.

The first peak 1132 and the second peak 1134 protrude out of the main body 110a. The height of the first peak 1132 and the second peak 1134 is arbitrary and can be selected according to need. In one embodiment, both the height of the first peak 1132 and that of the second peak 1134 range from about 150 nanometers to about 200 nanometers. The height of the first peak 1132 can be substantially equal to that of the second peak 1134. The highest points of the first peak 1132 and the second peak 1134 are defined as the farthest point away from the surface of the main body 110a. In one three-dimensional nano-structure 113, the highest point of the first peak 1132 is spaced from that of the second peak 1134 a certain distance ranging from about 20 nanometers to about 100 nanometers. The first peak 1132 and the second peak 1134 extend substantially along the X direction. The cross-section of the first peak 1132 and the second peak 1134 can be trapezoidal or triangular, and the shape of the first peak 1132 and the second peak 1134 can be substantially the same. In one embodiment, the cross-sections of the first peak 1132 and the second peak 1134 are triangular. In one embodiment, the first peak 1132, the second peak 1134, and the main body 110a form an integrated structure. Because of the limitation of the technology, the first surface 1132a and the second surface 1132b cannot be absolutely planar.

In each M-shaped three-dimensional nano-structure 113, the first peak 1132 and the second peak 1134 define the first groove 1136. The extending direction of the first groove 1136 is substantially the same as the extending direction of the first peak 1132 and the second peak 1134. The cross-section of the first groove 1136 is V-shaped. The depth $h_1$ of the first groove 1136 of different three-dimensional nano-structures 113 is substantially the same. The depth $h_1$ is defined as the distance between the highest point of the first peak 1132 and the lowest point of the first groove 1136. The depth of the first groove 1136 is less than the height of the first peak 1132 and the second peak 1134.

The second groove 1138 extends substantially along the extending direction of the three-dimensional nano-structures 113. The cross-section of the second groove 1138 is V-shaped or an inverse trapezium. Along the extending direction, the cross-section of the second groove 1138 is substantially the same. The depth $h_2$ of the second grooves 1138 between each two adjacent three-dimensional nano-structures 113 is substantially the same. The depth $h_2$ is defined as the distance between the highest point and the lowest point of the second groove 1138. The depth of the second groove 1138 is greater than that of the first groove 1136, and the ratio between $h_1$ and $h_2$ ranges from about 1:1.2 to about 1:3 ($1:1.2 \leq h_1:h_2 \leq 1:3$). The depth of the first groove 1136 ranges from about 30 nanometers to about 120 nanometers, and the depth of the second groove 1138 ranges from about 90 nanometers to about 200 nanometers. In one embodiment, the depth of the first groove 1136 is about 80 nanometers, and the depth of the second groove 1138 is about 180 nanometers. The depth of the first groove 1136 and the second groove 1138 can be selected according to need.

The width of the three-dimensional nano-structure 113 ranges from about 100 nanometers to about 200 nanometers. The width of the three-dimensional nano-structure 113 is defined as the maximum span of the three-dimensional nano-structure 113 along the Y direction. The span of the three-dimensional nano-structure 113 gradually decreases along the direction away from the substrate 100. Thus in each three-dimensional nano-structure 113, the distance between the highest point of the first peak 1132 and the highest point of the second peak 1134 is less than the width of the three-dimensional nano-structure 113. The plurality of three-dimensional nano-structures 113 can be distributed in a certain interval from each other, and the intervals can be substantially the same. The interval forms the second groove 1138. The distance $\lambda_0$ between the two adjacent three-dimensional nano-structures 120 ranges from about 0 nanometers to about 200 nanometers. The distance between each two adjacent three-dimensional nano-structures 120 can be substantially the same. The distance $\lambda_0$ can be increased with the increase of the height of both the first and second peak 1132 and 1134, and decreased with the decrease of the height of both the first and second peaks 1132 and 1134. In the Y direction, the distance $\lambda_0$ can be increased, decreased, or periodically varied. If the distance $\lambda_0=0$, the cross-section of the second groove 1138 is V-shaped. If the distance $\lambda_0>0$, the cross-section of the second groove 1138 is in the shape of an inverse trapezium.

Along the Y direction, the plurality of three-dimensional nano-structures 113 is distributed in a certain period P. One period P is defined as the width $\lambda$ of the three-dimensional nano-structures 113 added with the distance $\lambda_0$. The period P of the plurality of three-dimensional nano-structures 113 can range from about 100 nanometers to about 500 nanometers. The period P, the width $\lambda$, and the distance $\lambda_0$ satisfy the following formula: $P=\lambda+\lambda_0$. The period P, the width $\lambda$, and the distance $\lambda_0$ is measured in nanometers. The period P can be a constant, and $\lambda_0$ or $\lambda$ can be a dependent variable. Furthermore, one part of the three-dimensional nano-structures 113 can be aligned in a first period, and another part of the three-dimensional nano-structures 113 can be aligned in a second period. In one embodiment, the period P is about 200 nanometers, the width $\lambda$ is about 190 nanometers, and the distance $\lambda_0$ is about 10 nanometers.

The active layer 120 is located on the second surface of the first semiconductor layer 110. The active layer 120 is engaged with the first semiconductor layer 110. In detail, the active layer 120 covers the plurality of three-dimensional nano-structures 113, and the surface of the active layer 120 which is in contact with the first semiconductor layer 110 forms a patterned surface. The active layer 120 also includes a plurality of third grooves and third peaks, the third grooves are engaged with the first peaks 1132 and the second peaks 1134, and the third peaks are engaged with the first grooves 1136 and second grooves 1138. The active layer 120 is a photon excitation layer and can be one of a single layer quantum well film or multilayer quantum well films. The active layer 120 is made of GaInN, AlGaInN, GaSn, AlGaSn, GaInP, or GaInSn. In one embodiment, the active layer 120 has a thickness of about 0.3 μm and includes one layer of GaInN and another layer of GaN. The GaInN layer is stacked with the GaN layer.

The second semiconductor layer 130 is located on the active layer 120. The surface of the second semiconductor layer 130 which is away from the active layer 120 is configured as the light emitting surface of LED 10. In one embodiment, the second semiconductor layer 130 covers the entire surface of the active layer 120. The thickness of the second semiconductor layer 130 ranges from about 0.1 μm to about 3 μm. The second semiconductor layer 130 can be an N-type semiconductor layer or a P-type semiconductor layer. Furthermore, the type of the second semiconductor layer 130 is different from the type of the first semiconductor layer 110. A surface of the second semiconductor layer 130 is used as a light emitting surface of the LED 10. In one embodiment the second semiconductor layer 130 is a P-type gallium nitride doped with Mg.

The first electrode 112 covers the entire first surface of the first semiconductor layer 110. The first electrode 112 is used as a reflector to reflect the photons. The photons reaching the reflector will be reflected by the reflector, thus these photons can be extracted out of the LED 10. The first electrode 112 is a single layer structure or a multi-layer structure. The first electrode 112 can be an N-type electrode or a P-type electrode according to the first semiconductor layer 110. The material of the first electrode 112 can be Ti, Ag, Al, Ni, Au, or any combination of them. The material of the first electrode 112 can also be indium-tin oxide (ITO) or carbon nanotube film. In one embodiment, the first electrode 112 is a two-layer structure consisted of a Ti layer with about 15 nm in thickness and an Au layer with about 100 nm in thickness.

The second electrode 132 can be an N-type electrode or P-type electrode. In one embodiment, the second electrode 132 is located on the light emitting surface of LED 10. The type of the second electrode 132 is the same as the second semiconductor layer 130. The shape of the second electrode 132 is arbitrary and can be selected according to need. The second electrode 132 covers part surface or the entire surface of the second semiconductor layer 130. The material of the second electrode 132 can be Ti, Ag, Al, Ni, Au or any combination of them.

Furthermore, a reflector layer (not shown) can be sandwiched between the first semiconductor layer 110 and the first electrode 112. The material of the reflector can be titanium (Ti), silver (Ag), aluminum (Al), nickel (Ni), gold (Au), or any combination thereof. The reflector includes a smooth surface having a high reflectivity. The photons reach the reflector and will be reflected by the reflector, thus these photons can be extracted out of the LED 10 to improve the light extraction efficiency of the LED 10.

The first semiconductor layer 110 includes a plurality of three-dimensional nano-structures to form a patterned surface, and the active layer 120 is located on the patterned surface, thus the contact area between the first semiconductor layer 110 and the active layer 120 is enlarged. The electron-hole recombination density is improved, and the quantity of photons is increased. Thus the light extraction efficiency of the LED 10 can be improved.

Figure 5:
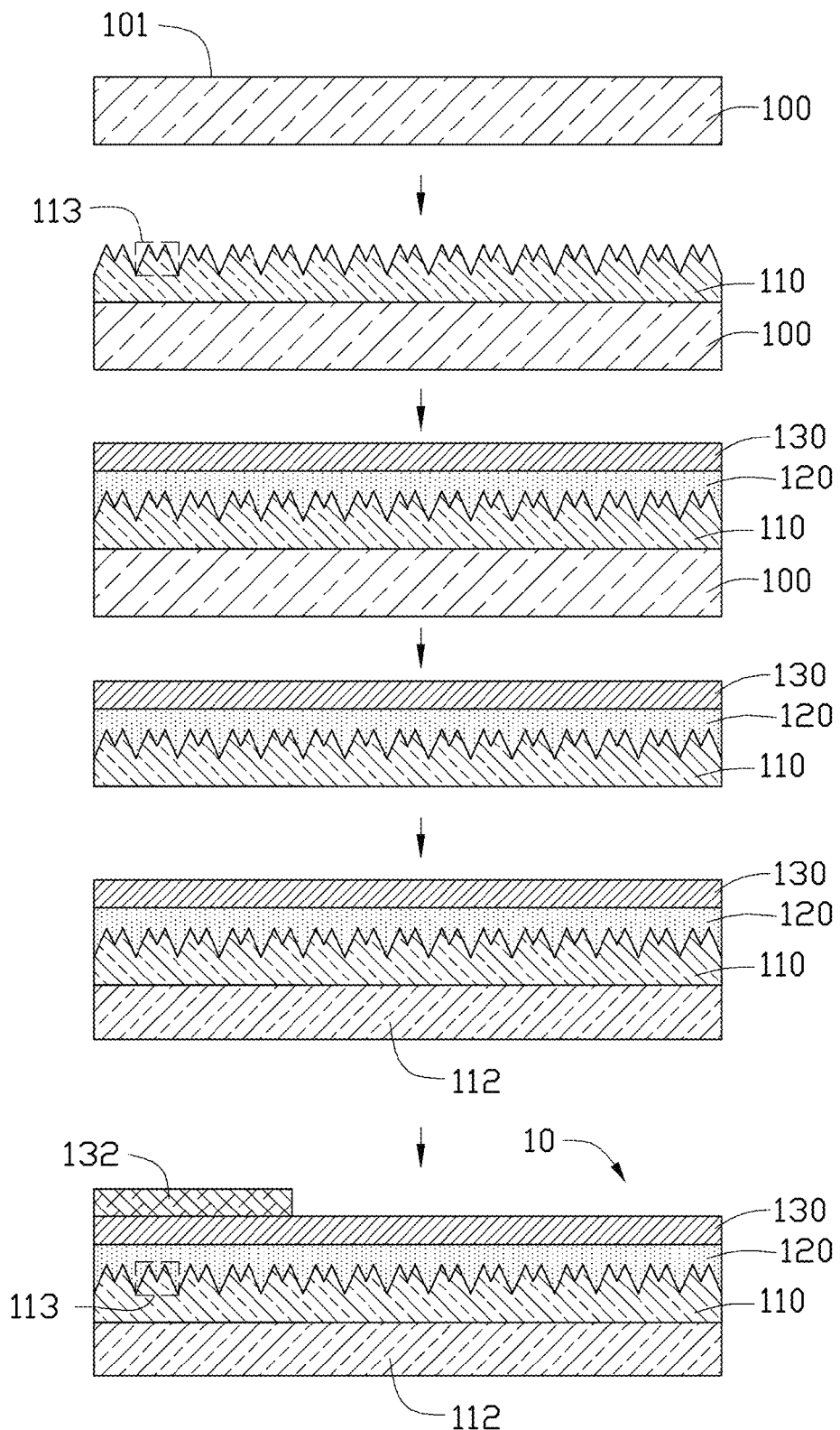
FIG. 5 illustrates one embodiment of a method for making an LED.

Referring to FIG. 5, one embodiment of a method for making the LED 10 includes the following steps:

S11, providing a substrate 100 with an epitaxial growth surface 101;

S12, growing a first semiconductor layer 110 on the epitaxial growth surface 101;

S13, forming a plurality of three-dimensional nano-structures 113 on the first semiconductor layer 110;

S14, growing an active layer 120 and a second semiconductor layer 130 on the surface of the plurality of three-dimensional nano-structures 113, and in that order;

S15, exposing a surface of the first semiconductor layer 110 by removing the substrate 100;

S16, applying a first electrode 112 to cover the exposed surface of the first semiconductor layer 110; and S17, locating a second electrode 132 electrically connected to the second semiconductor layer 130.

In step S11, a shape or a size of the substrate 100 is determined according to need. The substrate 100 includes an epitaxial growth surface 101 used to grow the first semiconductor layer 110. The epitaxial growth surface 101 is a clean and smooth surface. The substrate 100 can be a single-layer structure or a multi-layer structure. If the substrate 100 is a single-layer structure, the substrate 100 can be a single crystal structure having a crystal face used as the epitaxial growth surface 101. If the substrate 100 is a multi-layer structure, the substrate 100 should include at least one layer having the crystal face. The material of the substrate 100 can be GaAs, GaN, AlN, Si, SOL SiC, MgO, ZnO, LiGaO$_2$, LiAlO$_2$, or Al$_2$O$_3$. The first semiconductor layer 110 and the substrate 100 should have a small crystal lattice mismatch and a thermal expansion mismatch. The size, thickness, and shape of the substrate 100 can be selected according to need. In one embodiment, the substrate 100 is a sapphire substrate with a thickness of about 40 nm. The first semiconductor layer 110 and the substrate 100 should have a small crystal lattice mismatch and a thermal expansion mismatch. The size, thickness, and shape of the substrate 100 can be selected according to need. In one embodiment, the substrate 100 is a sapphire substrate.

In step S12, the first semiconductor layer 110 can be grown respectively via a process of molecular beam epitaxy (MBE), chemical beam epitaxy (CBE), vacuum epitaxy, low temperature epitaxy, selective epitaxial growth, liquid phase deposition epitaxy (LPE), metal organic vapor phase epitaxy (MOVPE), ultra-high vacuum chemical vapor deposition (UHVCVD), hydride vapor phase epitaxy (HYPE), and metal organic chemical vapor deposition (MOCVD).

In one embodiment, the first semiconductor layer 110 is Si-doped N-type GaN. The first semiconductor layer 110 is made by a MOCVD method, and the growth of the first semiconductor layer 110 is a heteroepitaxial growth. In the MOCVD method, the nitrogen source gas is high-purity ammonia (NH$_3$), the carrier gas is hydrogen (H$_2$), the Ga source gas is trimethyl gallium (TMGa) or triethyl gallium (TEGa), and the Si source gas is silane (SiH$_4$). The growth of the first semiconductor layer 110 includes the following steps:

S121, placing the substrate 100 with the first carbon nanotube layer 110 thereon into a reaction chamber and heating the substrate 100 to about 1100° C. to about 1200° C., introducing the carrier gas, and baking the substrate 100 for about 200 seconds to about 1000 seconds;

S122, growing the low-temperature GaN layer by reducing the temperature to a range from about 500° C. to 650° C. in the carrier gas atmosphere, and introducing the Ga source gas and the nitrogen source gas at the same time;

S123, stopping the flow of the Ga source gas in the carrier gas and nitrogen source gas atmosphere, increasing the temperature to a range from about 1100° C. to about 1200° C., and maintaining the temperature for about 30 seconds to about 300 seconds;

S124, growing the high quality first semiconductor layer 110 by maintaining the temperature of the substrate 100 in a range from about 1000° C. to about 1100° C., and reintroducing the Ga source gas again and the Si source gas.

In step S122, the low-temperature GaN is used as a buffer layer (not shown) to grow the first semiconductor layer 110. The thickness of the buffer layer is less than the thickness of the first carbon nanotube layer 110. Because the first semiconductor layer 110 and the substrate 100 have different lattice constants, the buffer layer is used to reduce the lattice mismatch during the growth process, thus the dislocation density of the first semiconductor layer 110 will be decreased.

Figure 6:
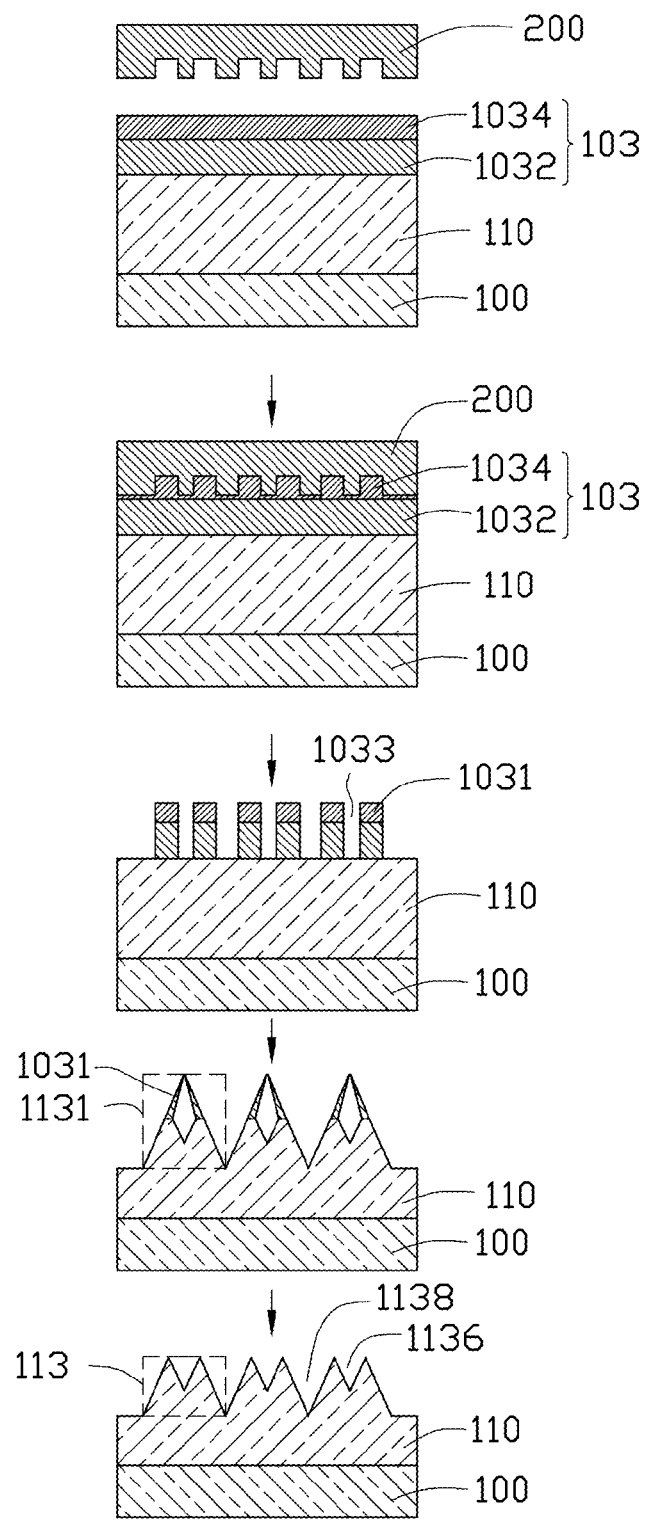
FIG. 6 illustrates one embodiment of forming a three-dimensional array in the method of FIG. 5.

Also referring to FIG. 6, in step S13, the plurality of three-dimensional nano-structures 113 can be formed by following substeps:

S131, locating a mask layer 103 on a surface of the first semiconductor layer 110;

S132, patterning the mask layer 103 by an imprinting and etching method;

S133, forming a plurality of three-dimensional nano-structure preforms 1131 by etching the first semiconductor layer 110;

S134, forming the plurality of three-dimensional nano-structures 113 by removing the mask layer 103.

In step S131, the mask layer 103 can be a single layered structure or a multi-layered structure. The thickness of the mask layer 103 can be selected according to need, such as the etching depth or the etching atmosphere. Hereafter the high precision of the pattern formed in the mask layer 103 can be achieved. The mask layer 103 is a single layered structure, and the material of the mask layer 103 can be ZEP520A which is developed by Zeon Corp of Japan, HSQ (hydrogen silsesquioxane), PMMA (Polymethylmethacrylate), PS (Polystyrene), SOG (silicon on glass), or other silitriangle oligomers. The mask layer 103 is used to protect a portion of the first semiconductor layer 110.

In one embodiment, the mask layer 103 is a multi-layered structure. The mask layer 103 includes a first mask layer 1032 and a second mask layer 1034 stacked on the first semiconductor layer 110 in that order, with the second mask layer 1034 covering the first mask layer 1032. The first mask layer 1032 and the second mask layer 1034 can be selected according to need. The material of the first mask layer 1032 can be ZEP520A, PMMA, PS, SAL601, or ARZ720. The material of the second mask layer 1034 can be HSQ, SOG, or other silitriangle oligomers. The second mask layer 1034 can be printed by a mechanical method to ensure the precision of the mask layer 103. In one embodiment, the material of the first mask layer 1032 is ZEP520A, and that of the second mask layer 1034 is HSQ. The first mask layer 1032 and the second mask layer 1034 can be formed by a screen printing method or a deposition method.

The step S131 includes sub-steps of:

S131a, forming the first mask layer 1032; and

S131b, forming the second mask layer 1034.

In the step S131a, the first mask layer 1032 is formed by the following steps. First, the first semiconductor layer 110 is cleaned in a clean room. Second, a layer of positive electron-beam resist can be spin-coated on the first semiconductor layer 110 at a speed of about 500 rounds per minute to about 6000 rounds per minute, for about 0.5 minutes to about 1.5 minutes. The positive electron-beam resist can be a ZEP520A resist, which is developed by Zeon Corp of Japan. Third, the first semiconductor layer 110 with the positive electron-beam resist can be dried at a temperature of about 140 degrees centigrade to 180 degrees centigrade, for about 3 minutes to about 5 minutes, thereby forming the first mask layer 1032 on the first semiconductor layer 110. The thickness of the first mask layer 1032 can be in a range of about 100 nanometers to about 500 nanometers.

In the step S131b, the mask layer 1034 can be a layer of HSQ resist. The HSQ resist is spin-coated on the first mask layer 1032 under high pressure at a speed of about 2500 rounds per minute to about 7000 rounds per minute, for about 0.5 minutes to about 2 minutes. The thickness of the second mask layer 1032 can range from about 100 nanometers to about 300 nanometers. The HSQ can be pressed to be deformed at room temperature. Moreover, the HSQ has good structural stability and provides a high resolution, often better than 10 nm.

Furthermore, a transition layer (not shown) can be deposited on the first mask layer 1032 before the step of forming the second mask layer 1034. In one embodiment, the transition layer can be a glassy silicon dioxide film with a thickness of about 10 nanometers to about 100 nanometers. The transition layer is used to protect the first mask layer 1032 during nanoimprinting the second mask layer 1034.

In step S132, the mask layer 103 can be patterned by the following method:

S132a, providing a patterned template 200;

S132b, attaching the template 200 on the second mask layer 1034, imprinting the template 200 to form a plurality of slots, and removing the template 200;

S132c, removing the residual second mask layer 1034 in the lowest point of the slot to expose the first mask layer 1032; and S132d, patterning the mask layer 103 by removing one part of the first mask layer 1032 corresponding with the slots.

In step S132a, the template 200 can be made of rigid materials, such as nickel, silicon, and carbon dioxide. The template 200 can also be made of flexible materials, such as PET, PMMA, polystyrene (PS), and polydimethylsiloxane (PDMS). The template 200 can be fabricated through an electron beam lithography method with the nano-pattern formed therein. The template 200 includes a plurality of protruding structures. The protruding structures are substantially parallel with each other and spaced from each other to form an array, concentric circles, or concentric rectangles. A slot is defined between the two adjacent protruding structures. The protruding structures form the nano-pattern of the template 200. The nano-pattern can be designed according to the actual application. In one embodiment, the protruding structures are plurality of protruding structures extending substantially along the same direction, and one slot is defined between the adjacent two bar-shape structures. The width of the protruding structure and that of the slot can be the same. In one embodiment, both the width of the protruding structure and that of the slot range from about 50 nanometers to about 200 nanometers.

In step S132b, the template 200 is then pressed towards the substrate 100 at room temperature. During this process, the protruding structures are pressed into the second mask layer 1034 to form a plurality of slots in the second mask layer 1034, and some materials of the second mask layer 1034 are remained at the lowest point of the slot. Finally, the template 200 is removed with the nano-pattern remaining in the second mask layer 1034. The nano-pattern of the second mask layer 1034 includes a plurality of second protruding structures and a plurality of slots. The protruding structures in the second mask layer 1034 correspond to the slots in the template 200. The slots in the second mask layer 1034 correspond to the protruding structures in the template 200.

In one embodiment, the template 200 is pressed in a vacuum environment of about $1 \times 10^{-1}$ millibars to about $1 \times 10^{-5}$ millibars. The pressure applied on the template 200 is about 2 pounds per square foot to about 100 pounds per square foot. The pressure is applied on the template 200 for about 2 minutes to about 30 minutes. There may be material of the second mask layer 1034 remaining at the lowest point of the slots.

In step S132c, the residual material of the second mask layer 1034 at the lowest point of the slots can be removed by plasma etching. In one embodiment, a $CF_4$ reactive plasma etching method can be used to remove the material of the second mask layer 1034 remaining at the lowest point of the slots. For example, the first semiconductor layer 110 with the protruding structures and the slots formed in the second mask layer 1034 can be placed in a $CF_4$ reactive plasma etching system. The $CF_4$ reactive plasma etching system generates $CF_4$ plasma, and the $CF_4$ plasma then moves towards the second mask layer 1034. The remaining material of the second mask layer 1034 at the lowest point of the slots will be etched away, so that the first mask layer 1032 correspond to the slots will be exposed. At the same time, the width of the top of the protruding structures in the second mask layer 1034 is decreased during the etching process, but the nano-pattern in the second mask layer 1034 will be maintained.

In step S132d, the first mask layer 1032 exposed from the slots can be removed by oxygen plasma etching. For example, the first semiconductor layer 110 after being treated by step S132d can be placed in an oxygen plasma etching system. The power of the oxygen plasma etching system can range from about 10 watts to about 150 watts. The speed of the oxygen plasma can range from about 2 sccm to about 100 sccm. The partial pressure of the oxygen plasma can range from about 0.5 Pa to about 15 Pa. The etching time can range from about 5 seconds to about 1 minute. During the process of etching the first mask layer 1032, the first mask layer 1032 exposed by the slots will be removed, and the first semiconductor layer 110 corresponding to the slots will be exposed. The protruding structures in the second mask layer 1034 function as a mask to the oxygen plasma to ensure the resolution of the first mask layer 1032.

During the etching process, the pattern in the second mask layer 1034 will be copied onto the first mask layer 1032 to form a patterned mask layer 103. The patterned mask layer 103 includes a plurality of protruding structures 1031 on the surface of the first semiconductor layer 110. Each protruding structure 1031 includes the first mask layer 1032 and the second mask layer 1034 stacked together. A slot 1033 is defined between each two adjacent protruding structures 1031, and the surface of the first semiconductor layer 110 which correspond to the slot 1033 is exposed. During the process of etching the first mask layer 1032, the top of the protruding structures of the second mask layer 1034 will also be partly etched. But the etching speed to the second mask layer 1034 is much lower than that of the first mask layer 1032, and the nano-pattern in the second mask layer 1034 can still be maintained. Thus, the resolution of the mask layer 103 can be improved.

In step S133, the first semiconductor layer 110 after step S132 can be placed in an inductively coupled plasma device to etch the first semiconductor layer 110 exposed by the mask layer 103. The etching gas can be selected according to the material of the first semiconductor layer 110 and the mask layer 103. During the etching process, the surface of the first semiconductor layer 110 exposed by the slots 1033 of the mask layer 103 will be etched, thereby forming a plurality of grooves in the first semiconductor layer 110.

The etching process of the first semiconductor layer 110 includes the following stages:

first stage, forming a plurality of grooves with substantially the same depth by etching the surface of the first semiconductor layer 110 by etching gas;

second stage, continuing the etching process so that every two adjacent protruding structures 1031 begin to slant face to face to form a protruding pair; and third stage, continuing the etching process so that the two adjacent protruding structures 1031 gradually slant until the top of the two adjacent protruding structures 1031 contact each other.

In the first stage, the etching gas etches the exposed surface of the first semiconductor layer 110 to form a plurality of grooves. The grooves have substantially the same depth because of substantially the same etching speed.

In the second stage, during the etching process, the etching gas will react with the first semiconductor layer 110 to form a protective layer. The protective layer will reduce the etching speed to the first semiconductor layer 110, and the width of the grooves will slowly decrease from the outer surface to the lowest point of the grooves. Thus, the inner wall of the grooves will not be absolutely perpendicular to the surface of the first semiconductor layer 110, but form an angle. Furthermore, the etching does not only etch the first semiconductor layer 110, but also etch the top of the protruding structures 1031. The width of the top of the protruding structures 1031 will decrease. The resolution of the mask layer 103 will not be affected because the etching speed of the top of the protruding structures 1031 is far smaller than that of the first semiconductor layer 110. Furthermore, every two adjacent protruding structures 1031 will slant face to face.

In the third stage, the top of the structures of the two adjacent protruding structures 1031 will gradually approach each other. The etching speed of the first semiconductor layer 110 corresponding to these two adjacent protruding structures 1031 will decrease, and the width of the grooves will gradually decrease from the outer surface to the lowest point of the grooves. Because the two adjacent protruding structures 1031 slant face to face to form a protruding pair, the etching speed of the first semiconductor layer 110 corresponding to the protruding pair will further decrease. Eventually, the top of the two adjacent protruding structures 1031 are contacting each other, and the etching gas can no longer etch the first semiconductor layer 110 corresponding to the two adjacent protruding structures 1031, thus the first groove 1136 is formed on the surface of the first semiconductor layer 110. But between every two protruding pairs, the etching speed will change less than that of the closed adjacent protruding structures 1031. Thus the second grooves 1138 is formed, and the depth of the second grooves 1138 will be greater than that of the first grooves 1136. The plurality of three-dimensional nano-structure preforms 1131 is then obtained on the first semiconductor layer 110.

In one embodiment, the etching gas includes $Cl_2$, $BCl_3$, $O_2$, and Ar. The power of the inductively coupled plasma device ranges from about 10 watts to about 100 watts, the flow speed of the etching gas ranges from about 8 sccm to about 150 sccm, the pressure of the etching gas can range from about 0.5 Pa to about 15 Pa, and the etching time can range from about 5 seconds to about 5 minutes. In the etching gas, the flow speed of the $Cl_2$ ranges about 2 sccm to about 60 sccm, the flow speed of the $BCl_3$ ranges from about 2 sccm to about 30 sccm, the flow speed of the $O_2$ ranges from about 3 sccm to about 40 sccm, and the flow speed of the Ar ranges from about 1 sccm to about 20 sccm. In one embodiment, the flow speed of the etching gas ranges from about 40 sccm to about 100 sccm to improve the resolution and the etching speed. In another embodiment, the power of the inductively coupled plasma device is about 70 watts, the flow speed of the etching gas is about 40 sccm, the pressure of the etching gas is about 2 Pa, and the etching time is about 2 minutes. In the etching gas, the flow speed of the $Cl_2$ is about 26 sccm, the flow speed of the $BCl_3$ is about 16 sccm, the flow speed of the $O_2$ is about 20 sccm, and the flow speed of the Ar is about 10 sccm.

The mask layer 103 and the etching gas are not limited. The etching gas can include only one gas or a mixture of different gases, as long as the top of the two adjacent protruding structures 1031 in the mask layer 103 can be closed to form the protruding pair. The flow speed of the etching gas, the pressure, the etching time, and the ratio between the different gases can be dependent upon the three-dimensional nano-structure 103.

In step S134, the mask layer 103 can be removed by dissolving in a stripping agent such as tetrahydrofuran (THF), acetone, butanone, cyclohexane, hexane, methanol, or ethanol. In one embodiment, the stripping agent is butanone, and the mask layer 103 is dissolved in butanone and separated from the first semiconductor layer 110. The plurality of three-dimensional nano-structures 113 is formed on the first semiconductor layer 110 by removing the mask layer 103. The plurality of three-dimensional nano-structures 113 and the first semiconductor layer 110 are integrated to an integrated structure.

The plurality of three-dimensional nano-structures 113 can also be formed by locating another dielectric layer (not shown) or a semiconductor layer (not shown) on the first semiconductor layer 110 and etching the dielectric layer. Thus the plurality of three-dimensional nano-structures 113 is located on the surface of the first semiconductor layer 110.

In step S14, the growth method of the active layer 120 is similar to the first semiconductor layer 110. In one embodiment, the indium source gas is trimethyl indium. The growth of the active layer 120 after the growth of the first semiconductor layer 110 includes the following steps:

(a1) stopping the flow of the Si source gas and maintaining the temperature of the reaction chamber to a range from about 700° C. to about 900° C., the pressure of the reaction reaction chamber range from about 50 torrs to about 500 torrs; and (a2) introducing the indium source gas and growing InGaN/GaN multilayer quantum well film to form the active layer 120.

In step (a1), the substrate 100 is located into a horizontal epitaxial growth reactor, and the active layer 120 grows via a horizontal epitaxial growth method. The growth direction of the active layer 120 can be controlled by the horizontal growth speed and the vertical growth speed. Thus the surface of the active layer 120 which is away from the first semiconductor layer 110 can be planar.

The second semiconductor layer 130 is grown after the growth of the active layer 120. In one embodiment, the Mg source gas is ferrocene magnesium ($Cp_2Mg$), and the method includes the following steps:

(b1) stopping the flow of the indium source gas and maintaining the temperature of the reaction chamber in a range from about 1000° C. to about 1100° C., and maintaining the pressure of the reaction chamber in a range from about 76 torrs to about 200 torrs; and (b2) introducing the Mg source gas and growing P-type gallium nitride doped with Mg to form the second semiconductor layer 130.

In step S15, the substrate 100 can be removed by laser irradiation, etching, or thermal expansion and contraction. The removal method can be selected according to the material of the substrate 100 and the first semiconductor layer 110. In one embodiment, the substrate 100 is removed by laser irradiation. The substrate 100 can be removed from the first semiconductor layer 110 by the following steps:

S151, polishing and cleaning the surface of the substrate 100 away from the first semiconductor layer 110;

S152, placing the substrate 100 on a platform (not shown) and irradiating the substrate 100 and the first semiconductor layer 110 with a laser; and S153, immersing the substrate 100 into a solvent and removing the substrate 100.

In step S151, the substrate 100 can be polished by a mechanical polishing method or a chemical polishing method to obtain a smooth surface. Thus the scatting of the laser will decrease. The substrate 100 can be cleaned with hydrochloric acid or sulfuric acid to remove the metallic impurities and oil.

In step S152, the substrate 100 is irradiated by the laser from the polished surface, and the incidence angle of the laser is substantially perpendicular to the surface of the substrate 100. The wavelength of the laser is selected according to the material of the first semiconductor layer 110 and the substrate 100. The energy of the laser is smaller than the bandgap energy of the substrate 100 and larger than the bandgap energy of the first semiconductor layer 110. Thus the laser can pass through the substrate 100 and reach the interface between the substrate 100 and the first semiconductor layer 110. The buffer layer at the interface has a strong absorption of the laser, and the temperature of the buffer layer will be raised rapidly. Thus the buffer layer will be decomposed. In one embodiment, the bandgap energy of the first semiconductor layer 110 is about 3.3 ev, and the bandgap energy of the substrate 100 is about 9.9 ev. The laser is a KrF laser, the wavelength of the laser is about 248 nm, the energy is about 5 ev, the pulse width range is about 20 nanoseconds to about 40 nanoseconds, the energy density ranges from about 400 mJ/cm$^2$ to about 600 mJ/cm$^2$, and the shape of the laser pattern is square with a size of 0.5 mm×0.5 mm. The laser moves from one edge of the substrate 100 with a speed of 0.5 mm/s During the irradiating process, the GaN is decomposed to Ga and N$_2$. The parameter of the laser can be adjusted according to need. The wavelength of the laser can be selected according to the absorption of the buffer layer.

Because the buffer layer has a strong absorption of the laser, the buffer layer can decompose rapidly. However, the first semiconductor layer 110 has weak absorption, so it does not decompose quickly. The irradiating process can be performed in a vacuum or a protective gas environment. The protective gas can be nitrogen, helium, argon or other inert gas.

In step S153, the substrate 100 can be immersed into an acidic solution to remove the Ga decomposed from GaN so that the substrate 100 can be peeled off from the first semiconductor layer 110. The acidic solution can be hydrochloric acid, sulfuric acid, or nitric acid which can dissolve the Ga.

In step S16, the first electrode 112 can be formed via a process of physical vapor deposition on the first surface of the first semiconductor layer, such as electron beam evaporation, vacuum evaporation, ion sputtering, or any physical deposition. Furthermore, the first electrode 112 can also be formed by directly attaching a conductive sheet on the exposed portion of the first semiconductor layer 110. The first electrode 112 can cover the entire first surface of the first semiconductor layer 110 away from the active layer 120. Thus the LED 10 forms a vertical structure, the current diffusion speed will be improved, and the heat produced in the LED 10 will decrease.

In step S17, the method for making the second electrode 132 is the same as that of the first electrode 112. The second electrode 132 is located on the surface of the second semiconductor layer 130 away from the active layer 120. The second electrode 132 is a continuous layered-structure and covers part surface of the second semiconductor layer 130. While the second electrode 132 is transparent, the second electrode 132 can cover entire surface of the second semiconductor layer to improve the vertical current density.

The method for making the LED 10 has the following advantages. First, the nano-imprinting method can be carried out at room temperature, and the template does not need pre-treatment, thus the method is simple and low in cost. Second, the plurality of M-shaped three-dimensional structures can be easily formed on the first semiconductor layer 110, and the productivity of the LED can be improved. Third, the contact surface between the active layer 120 and the first semiconductor layer 110 is increased, and the electron-hole recombination density is improved, thus the light extraction efficiency of LED is improved.

Figure 7:
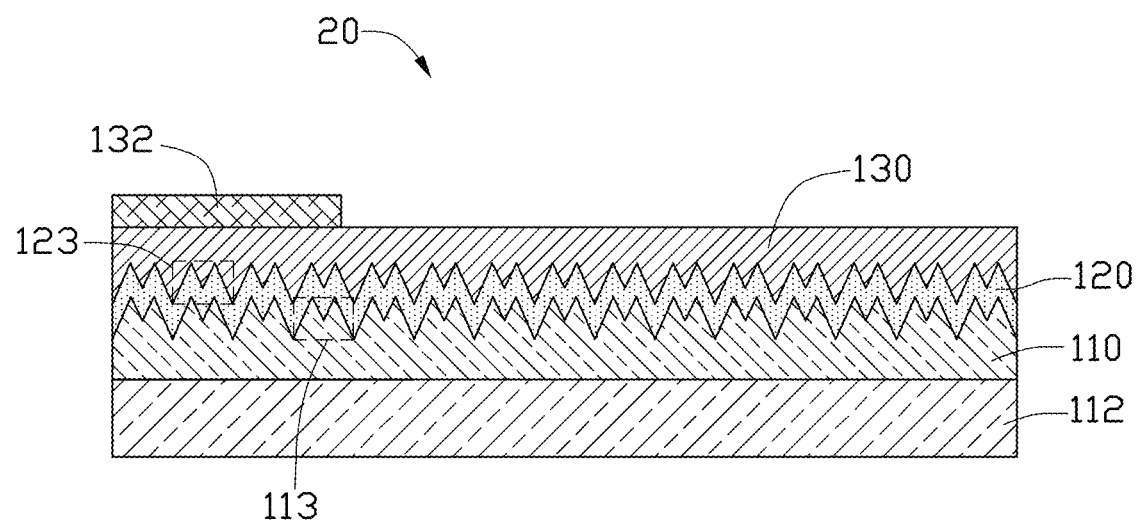
FIG. 7 shows a schematic view of one embodiment of an LED.

Referring to FIG. 7, an LED 20 includes a first semiconductor layer 110, an active layer 120, a second semiconductor layer 130, a first electrode 112, a second electrode 132, a plurality of three-dimensional nano-structures 113, and a plurality of second three-dimensional nano-structures 123. The active layer 120 is sandwiched between the first semiconductor layer 110 and the second semiconductor layer 130. The first semiconductor layer 110 includes a first surface and an opposite second surface. The first electrode 112 covers the entire first surface of the first semiconductor layer 110. The active layer 120 and the second semiconductor layer 130 are stacked on the second surface in that order. The plurality of three-dimensional nano-structures 113 is located on the second surface to form a patterned surface. The second electrode 132 is electrically connected with the second semiconductor layer 130. The plurality of three-dimensional nano-structures 123 is located on the surface of the active layer 120 which is away from the first semiconductor layer 110. The structure of the LED 20 is similar to the structure of the LED 10, except the LED 20 further includes the plurality of three-dimensional nano-structures 123 located on the active layer 120 which is away form the first semiconductor layer 110.

Figure 8:
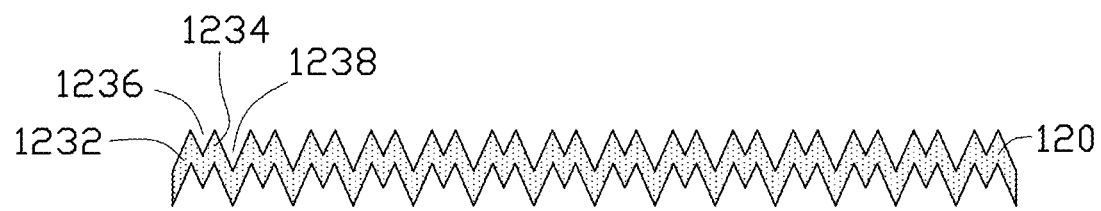
FIG. 8 shows a schematic view of the active layer of FIG. 7.

Further referring to FIG. 8, the plurality of three-dimensional nano-structures 123 forms a patterned surface of the active layer 120. The three-dimensional nano-structure 123 is similar to the three-dimensional nano-structures 113. Each three-dimensional nano-structure 123 includes a first peak 1232 and a second peak 1234, a first groove 1236 defined between the first peak 1232 and the second peak 1234, and a second groove 1238 defined between two adjacent three-dimensional nano-structures 123. The distribution and alignment of the three-dimensional nano-structures 123 is the same as the distribution and alignment of the three-dimensional nano-structures 113. The second semiconductor layer 130 is located on the surface of the three-dimensional nano-structures 113, thus the surface of the second semiconductor layer 130 near the active layer 120 also forms a patterned surface.

In LED 20, the surface of the active layer contacting the second semiconductor layer also includes a plurality of second three-dimensional nano-structures 123, thus the contact area between the surface of the second semiconductor layer and the active layer is also enlarged. The electron-hole recombination density is further increased, and the light extraction efficiency of the LED 20 can be improved.

Figure 9:
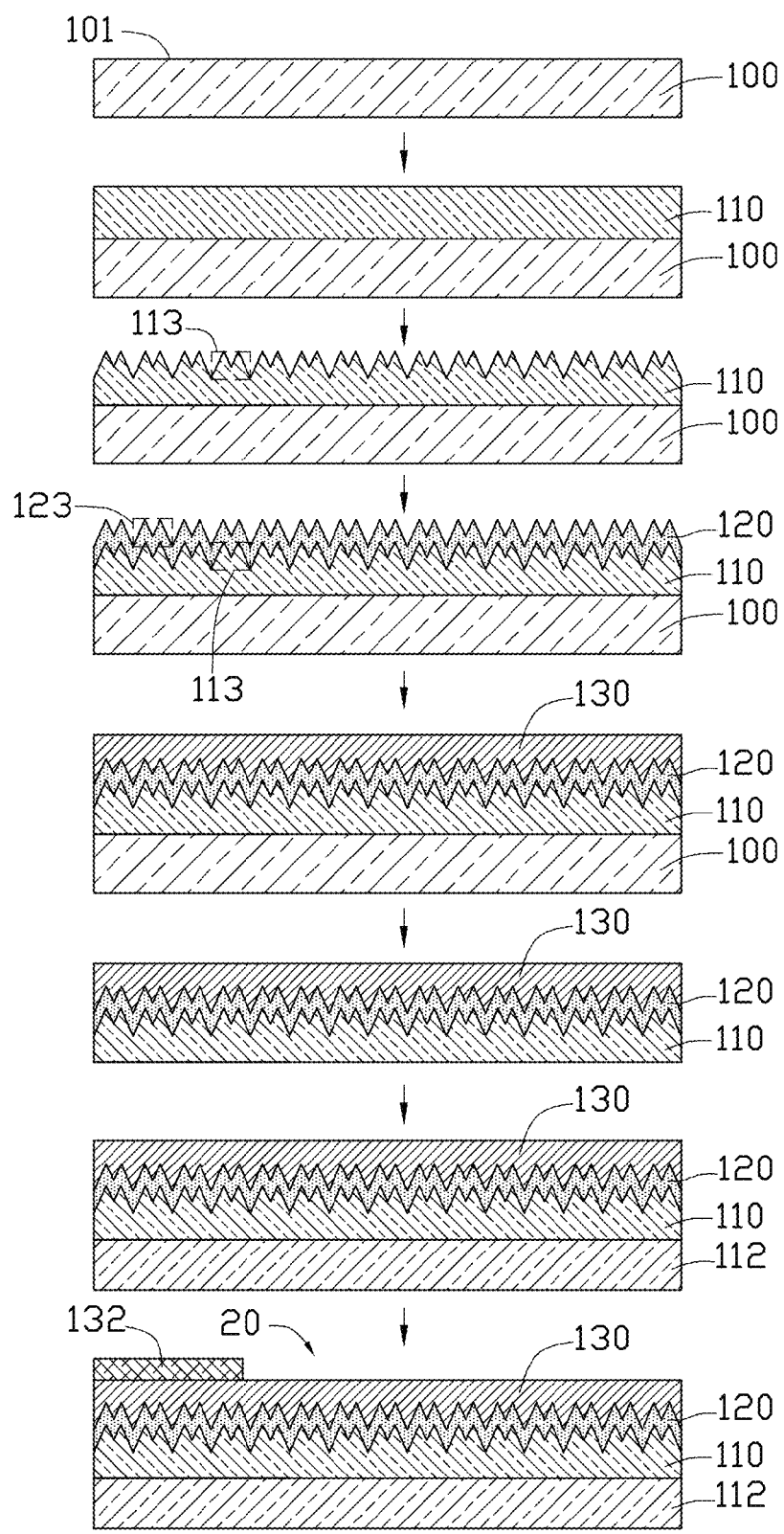
FIG. 9 illustrates one embodiment of a method for making an LED of FIG. 7.

Referring to FIG. 9, one embodiment of a method for making the LED 20 includes the following steps:

S21, providing a substrate 100 having a epitaxial growth surface 101;

S22, growing a first semiconductor layer 110;

S23, forming a plurality of three-dimensional nano-structures 113 on a surface of the semiconductor layer 110;

S24, growing an active layer 120 on the surface of the three-dimensional nano-structures 113 in that order, and forming a plurality of three-dimensional nano-structures 123 on the surface which is away from the first semiconductor layer 110;

S25, growing a second semiconductor layer 130 on the surface of second three-dimensional nano-structures 123;

S26, exposing a surface of the first semiconductor layer 110 by removing the substrate 100;

S27, applying a first electrode 112 on the exposed surface of the first semiconductor layer 110; and S28, applying a second electrode 132 electrically connected to the second semiconductor layer 130.

The method of making the LED 20 is similar to the method of making the LED 10, except that the plurality of three-dimensional nano-structures 123 are formed on the surface of the active layer 120 which is away from the first semiconductor layer 110. The substrate 100 with the first semiconductor layer 110 is located in a vertical epitaxial growth reactor, and the active layer 120 grows by a vertical epitaxial growth method. Thus the plurality of the three-dimensional nano-structures 123 is formed on the surface of the active layer 120. Furthermore, the distribution and alignment of the three-dimensional nano-structures 123 is the same as the three-dimensional nano-structure 113.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A method for making a light emitting diode, comprising:
providing a substrate have an epitaxial growth surface;
growing a first semiconductor layer on the epitaxial growth surface of the substrate;
locating a patterned mask layer on a surface of the first semiconductor layer, wherein the patterned mask layer comprises a plurality of bar-shaped protruding structures aligned side by side, and a slot is defined between each two adjacent protruding structures of the plurality of bar-shaped protruding structures to expose a portion of the first semiconductor layer;
etching the exposed first semiconductor layer, wherein the each two adjacent protruding structures begin to slant face to face until they are contacting each other to form a protruding pair;
forming a plurality of three-dimensional nano-structures by removing the patterned mask layer;
growing an active layer on a surface of the plurality of three-dimensional nano-structures;
growing a second semiconductor layer on the active layer;
exposing a surface of the first semiconductor layer by removing the substrate;
applying a first electrode covering and electrically connecting with the entire surface of the first semiconductor layer away from the active layer; and
locating a second electrode to electrically connect with the second semiconductor layer.

2. The method of claim 1, wherein the each two adjacent protruding structures gradually slant, and tops of the each two adjacent protruding structures gradually approach each other.

3. The method of claim 2, wherein a first part of the first semiconductor layer corresponding to each of the protruding pairs is etched at a first speed, and a second part of the first semiconductor layer exposed from the each two adjacent protruding pairs is etched at a second speed, and the first speed is less than the second speed.

4. The method of claim 3, wherein a first groove is defined on the first part of the first semiconductor layer, and a second groove is defined on the second part of the first semiconductor layer.

5. The method of claim 4, wherein a depth of the first groove is less than a depth of the second groove.

6. The method of claim 5, wherein the depth of the first groove ranges from about 30 nanometers to about 120 nanometers, and the depth of the second groove ranges from about 100 nanometers to about 200 nanometers.

7. The method of claim 1, wherein the first semiconductor layer is etched in an inductively coupled plasma device, and a power of the inductively coupled plasma device ranges from about 20 watts to about 100 watts.

8. The method of the claim 7, wherein the substrate is etched by:
etching the surface of the first semiconductor layer to form a plurality of grooves with substantially the same depth;
etching the first semiconductor layer so that the each two adjacent protruding structures begin to slant face to face; and
further etching the first semiconductor layer so that the each two adjacent protruding structures gradually slant until the top of the each two adjacent protruding structures are contacting each other.

9. The method of claim 7, wherein an etching gas comprising $Cl_2$, $BCl_3$, $O_2$, and Ar is used in the etching process.

10. The method of claim 9, wherein a flow speed of the etching gas ranges from about 8 sccm to about 150 sccm, a pressure of the etching gas ranges from about 0.5 Pa to about 15 Pa, and an etching time ranges from about 5 seconds to about 5 minutes.

11. The method of claim 10, wherein a flow speed of the $Cl_2$ ranges from about 2 sccm to about 60 sccm, a flow speed of the $BCl_3$ ranges from about 2 sccm to about 30 sccm, a flow speed of the $O_2$ ranges from about 3 sccm to about 40 sccm, and a flow speed of the Ar ranges from about 1 sccm to about 20 sccm.

12. The method of claim 1, wherein the patterned mask layer is formed by the following steps:
placing a mask layer on the surface of the first semiconductor layer;
forming a plurality of bar-shaped protruding structures aligned side by side by nanoimprinting the mask layer, wherein a slot is defined between the each two adjacent protruding structures of the plurality of bar-shaped protruding structures; and
exposing the substrate by etching the mask layer through the slot.

13. The method of claim 1, wherein the patterned mask layer comprises a first mask layer and a second mask layer stacked on the first semiconductor layer in that order, and the material of the first mask layer is different from that of the second mask layer.

14. The method of claim 13, wherein the patterned mask layer is patterned by the following steps:

providing a template with a plurality of protruding structures aligned side by side and extending substantially along the same direction;
attaching the template on the second mask layer;
pressing the template toward the second mask layer and removing the template to form a plurality of slots in the second mask layer;
exposing the first mask layer by etching the second mask layer on the bottom of the slots through the slots; and
exposing the first semiconductor layer by etching the exposed first mask layer.

15. The method of claim 1, wherein the plurality of three-dimensional nano-structures is periodically aligned.

16. The method of claim 15, wherein a period of the plurality of the three-dimensional nano-structures ranges from about 100 nanometers to about 500 nanometers.

17. The method of claim 1, wherein the active layer grows on the plurality of three-dimensional nano-structures via a horizontal growth method to form a planar surface of the active layer away from the first semiconductor layer.

18. The method of claim 1, wherein the active layer grows on the plurality of three-dimensional nano-structures via a vertical growth method to form a patterned surface of the active layer away from the first semiconductor layer.

19. The method of claim 18, wherein the patterned surface of the active layer comprises a plurality of grooves and peaks.

20. A method for making light emitting diode, comprising:
providing a substrate having an epitaxial growth surface;
growing a first semiconductor layer on the epitaxial growth surface;
forming a plurality of three-dimensional nano-structures on a surface of the first semiconductor layer, wherein each of the plurality of three-dimensional nano-structures has a first peak and a second peak aligned side by side, a first groove is defined between the first peak and the second peak, a second groove is defined between each two adjacent three-dimensional nano-structures of the plurality of three-dimensional nano-structures, and a depth of the first groove is less than a depth of the second groove;
growing an active layer on the plurality of three-dimensional nano-structures;
growing a second semiconductor layer on the active layer;
removing the substrate;
applying a first electrode to cover and electrically connect with the entire surface of the first semiconductor layer away from the active layer; and
applying a second electrode to electrically connect with the second semiconductor layer.

\* \* \* \* \*